United States Patent
Phatak

(10) Patent No.: US 9,343,523 B2
(45) Date of Patent: May 17, 2016

(54) SELECTOR DEVICE USING LOW LEAKAGE DIELECTRIC MIMCAP DIODE

(71) Applicant: Intermolecular, Inc., San Jose, CA (US)

(72) Inventor: Prashant B. Phatak, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/599,878

(22) Filed: Jan. 19, 2015

(65) Prior Publication Data

US 2015/0140779 A1 May 21, 2015

Related U.S. Application Data

(63) Continuation of application No. 13/693,820, filed on Dec. 4, 2012, now Pat. No. 8,976,565.

(51) Int. Cl.
| | |
|---|---|
| *G11C 11/36* | (2006.01) |
| *H01L 49/02* | (2006.01) |
| *H01L 45/00* | (2006.01) |
| *H01L 27/24* | (2006.01) |
| *H01L 21/02* | (2006.01) |
| *H01L 21/283* | (2006.01) |
| *H01L 21/3205* | (2006.01) |

(52) U.S. Cl.
CPC ............ *H01L 28/60* (2013.01); *H01L 21/0217* (2013.01); *H01L 21/0228* (2013.01); *H01L 21/0234* (2013.01); *H01L 21/02164* (2013.01); *H01L 21/02178* (2013.01); *H01L 21/02181* (2013.01); *H01L 21/02186* (2013.01); *H01L 21/02189* (2013.01); *H01L 21/02192* (2013.01); *H01L 21/02323* (2013.01); *H01L 21/283* (2013.01); *H01L 21/32055* (2013.01); *H01L 27/2418* (2013.01); *H01L 27/2463* (2013.01); *H01L 45/00* (2013.01); *H01L 45/08* (2013.01); *H01L 45/1233* (2013.01); *H01L 45/146* (2013.01)

(58) Field of Classification Search
CPC ..... H01L 45/145; H01L 45/146; H01L 45/08; H01L 45/085
USPC ............... 257/E45.002, E45.003, 5; 365/148, 365/149, 175
See application file for complete search history.

(56) References Cited

U.S. PATENT DOCUMENTS

| | | | | |
|---|---|---|---|---|
| 2001/0044205 A1* | 11/2001 | Gilbert | ............. | H01L 21/32139 438/653 |
| 2005/0235905 A1* | 10/2005 | Senzaki | ............. | C23C 16/0272 117/88 |
| 2009/0290407 A1* | 11/2009 | Mouli | .................. | H01L 27/101 365/158 |
| 2010/0148324 A1* | 6/2010 | Chen | .................. | H01L 27/2418 257/656 |
| 2010/0330269 A1* | 12/2010 | Chen | ....................... | C23C 16/56 427/123 |
| 2012/0235109 A1* | 9/2012 | Nojiri | .................. | H01L 27/101 257/4 |

\* cited by examiner

*Primary Examiner* — Kimberly Rizkallah
*Assistant Examiner* — Maria Ligai

(57) ABSTRACT

MIMCAP diodes are provided that can be suitable for memory device applications, such as current selector devices for cross point memory array. The MIMCAP diodes can have lower thermal budget as compared to Schottky diodes and controllable lower barrier height and lower series resistance as compared to MIMCAP tunneling diodes. The MIMCAP diode can include a barrier height modification layer, a low leakage dielectric layer and a high leakage dielectric layer. The layers can be sandwiched between two electrodes.

17 Claims, 12 Drawing Sheets

SELECTOR DEVICE USING LOW LEAKAGE DIELECTRIC MIMCAP DIODE

CROSS-REFERENCE TO RELATED APPLICATIONS

This is a Continuation Application of U.S. patent application Ser. No. 13/693,820, filed Dec. 4, 2012, which is herein incorporated by reference for all purposes.

FIELD OF THE INVENTION

This invention relates generally to nonvolatile memory elements, and more particularly, to methods for forming resistive switching memory elements used in nonvolatile memory devices

BACKGROUND

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments. Nonvolatile memory is often formed using electrically-erasable programmable read only memory (EPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive switching nonvolatile memory.

Resistive memory device, e.g., resistive switching nonvolatile random access memory (ReRAM) is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

Resistive switching based on transition metal oxide switching elements formed of metal oxide films has been demonstrated. Although metal oxide films such as these exhibit bistability, the resistance of these films and the ratio of the high-to-low resistance states are often insufficient to be of use within a practical nonvolatile memory device. For instance, the resistance states of the metal oxide film should preferably be significant as compared to that of the system (e.g., the memory device and associated circuitry) so that any change in the resistance state change is perceptible. The variation of the difference in resistive states is related to the resistance of the resistive switching layer. Therefore, a low resistance metal oxide film may not form a reliable nonvolatile memory device. For example, in a nonvolatile memory that has conductive lines formed of a relatively high resistance metal such as tungsten, the resistance of the conductive lines may overwhelm the resistance of the metal oxide resistive switching element. Therefore, the state of the bistable metal oxide resistive switching element may be difficult or impossible to sense.

Similar issues can arise from integration of the resistive switching memory element with current selector elements, such as diodes and/or transistors. Selector devices in non volatile memory structures can screen the memory elements from sneak current paths to ensure that only the selected bits are read or programmed. Schottky diode can be used as a selector device, which can include p-n junction diode or metal-semiconductor diode, which requires high thermal budget that may not be acceptable for 3D memory application. Metal-Insulator-Metal Capacitor (MIMCAP) tunneling diodes may have a challenge of getting controllable low barrier height and low series resistance.

Therefore, there is a need for a selector diode that can meet the design criteria for advanced memory devices.

SUMMARY

In some embodiments, MIMCAP diodes are provided that can be suitable for memory device applications. The MIMCAP diode can have lower thermal budget as compared to Schottky diodes and controllable lower barrier height and lower series resistance as compared to MIMCAP tunneling diodes.

In some embodiments, the MIMCAP diode can include a barrier height modification layer, a low leakage dielectric layer, and a high leakage dielectric layer. The layers can be sandwiched between two electrodes. In some embodiments, the barrier height modification layer can function as an electrode.

The barrier height modification layer can function to change the barrier height at one electrode of the MIMCAP diode, providing a MIMCAP structure that has an asymmetric energy barrier bands. For example, the barrier height modification layer can include a charged sheet or a layer that has an internal field. The barrier height modification layer can have a larger band gap than an adjacent layer. The barrier height modification layer can include $AlO_x$, AlN, doped $ZrO_x$ or doped $HfO_x$, $SiO_2$, SiN. The thickness of the barrier height modification layer can be between 1 and 5 nm, or can be between 1 and 3 nm.

The low leakage dielectric layer can function to restrict the current flow across the MIMCAP diode, especially in the reverse bias condition. The leakage of the low leakage dielectric layer can be optimized to not significantly affect the current flow during the forward bias, and to significantly limit the current flow during the reverse bias. The low leakage dielectric layer can include $ZrO_x$, $HfO_x$, doped $ZrO_x$ or doped $HfO_x$. The thickness of the low leakage dielectric layer can be between 3 and 10 nm.

The high leakage dielectric layer can function to enhance the current flow across the MIMCAP diode, especially at the forward bias condition. The leakage of the high leakage dielectric layer can be optimized to allow high current flow during the forward bias while not provide current flow during the reverse bias. The high leakage dielectric layer can include $ZrO_x$, $HfO_x$, $TiO_x$, $NbO_x$, or ZnO. The thickness of the low leakage dielectric layer can be between 3 and 10 nm. In some embodiments, the low leakage dielectric layer and the high leakage dielectric layer are interdependent, wherein the combination of these two layers can enhance the diode characteristics of the MIMCAP diode, providing high current flow during forward bias and negligible current flow during reverse bias.

In some embodiments, methods to form MIMCAP diodes are provided, including performing treatments after depositing the barrier height modification layer, the low leakage dielectric layer, and/or the high leakage dielectric layer. The treatment can include rapid thermal annealing or plasma treatment, such as a rapid thermal anneal in temperatures between 200 and 4000, plasma oxygen anneal, and/or in-situ annealing after deposition. The treatments can modify the deposited layers to achieve the desired diode characteristics.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1A:
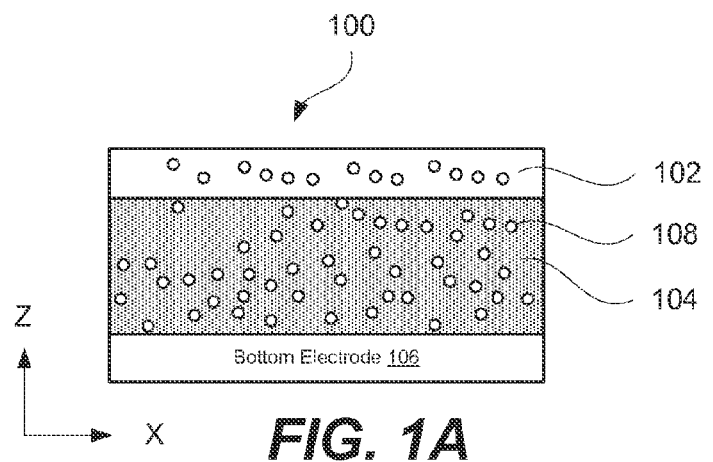
FIGS. 1A-1O illustrate a schematic representation of a ReRAM operation according to some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

In some embodiments, selector devices, and methods to fabricate selector devices, for resistive-switching memory elements and cross point memory array are provided. The selector device can be constructed using familiar and available materials currently used in fabrication facilities. The fabrication process of the selector device can require low thermal budget, suitable for back end or 3D memory applications. In addition, the process can be simple, providing a robust process for manufacturing.

In some embodiments, the selector devices can include a layer of barrier height modification, a low leakage dielectric and a high leakage dielectric sandwiched between two electrodes. The barrier height modification can function to change the barrier height at one electrode of the MIMCAP diode, providing a MIMCAP structure that has an asymmetric barrier energy band. The low leakage dielectric layer can function to restrict the current flow across the MIMCAP diode, especially at the reverse bias condition. The high leakage dielectric layer can function to enhance the current flow across the MIMCAP diode, especially at the forward bias condition.

A ReRAM cell exhibiting resistive switching characteristics generally includes multiple layers formed into a stack. The structure of this stack is sometimes described as a Metal-Insulator-Metal (MIM) structure. Specifically, the stack includes two conductive layers operating as electrodes. These layers may include metals and/or other conductive materials. The stack also includes an insulator layer disposed in between the electrodes. The insulator layer exhibits resistive switching properties characterized by different resistive states of the material forming this layer. As such, this insulator layer is often referred to as a resistive switching layer. These resistive states may be used to represent one or more bits of information. The resistance switching properties of the insulator layer are believed to depend on various defects' presence and distribution inside this layer. For example, different distribution of oxygen vacancies in the layer may reflect different resistance states of the layer, and these states may be sufficiently stable for memory application.

To achieve a certain concentration of defects in the resistance switching layer, the layer has been conventionally deposited with defects already present in the layer, i.e., with preformed defects. In other words, defects are introduced into the layer during its formation. For example, tightly controlled Atomic Layer Deposition (ALD), Physical Vapor Deposition (PVD), Chemical Vapor Deposition (CVD), Pulsed Layer Deposition (PLD), or some other low-temperature process to remain within a Back End of Line (BEOL) thermal budget may be used to deposit the insulator layer of the stack. It may be difficult to precisely and repeatedly control formation of these defects particularly in very thin resistance switching layers (e.g., less than 100 Angstroms). For example, when ALD is used to form resistance switching layers, some unreacted precursors may leave carbon-containing residues that impact resistance characteristics of the deposition layers and ReRAM cells including these layers. Furthermore, achieving precise partial saturation repeatedly may be very difficult if possible at all. In the case of PVD, sputtering targets tend to wear out influencing the deposition rates and creating variation in resulting resistance switching layers.

Methods of forming nonvolatile memory elements can involve transferring oxygen from precursor layers (used to form or, more specifically, converted into resistance switching layers) to electrodes during annealing of the stacks. The annealing environment may include some hydrogen to control distribution of oxygen within the annealed structure.

As stated above, oxygen diffusion from the precursor layer into the electrode converts the precursor layer into a resistance switching layer. The precursor layer may include a stoichiometric oxide or near-stoichiometric oxide that cannot function as a resistance switching layer until oxygen vacancies or some other defects are formed within that layer. The metal of this oxide may be more electronegative than the metal of the electrode used to trap the oxygen diffused out of the precursor level. The electrode may have substantially no oxygen, at least prior to the oxygen transfer, but may form an oxide during annealing.

The stack may have a reactive electrode that receives some oxygen during annealing and inert electrode that generally does not participate in oxygen transfer. The inert electrode may be also referred to as an oxygen-resistant electrode and may be made from titanium nitride, tantalum nitride, platinum, gold, and the like. Other suitable materials for inert electrodes include various conductive oxides, such as iridium oxide and ruthenium oxide. In some embodiments, the inert electrode includes an oxide sub-layer facing the resistance switching layer. The rest of the electrode may be formed by the metal of this oxide and may be generally free of oxygen. For example, an initial structure may be fabricated from a metal and then pretreated to form an oxide layer resulting in an inert electrode. This electrode then receives a precursor layer and another reactive electrode formed over the precursor layer. During subsequent annealing, the inert electrode does not experience any significant oxygen transfer, while the reactive electrode receives oxygen from the precursor layer that is converted into the resistive switching oxide layer as it loses oxygen.

If an inert electrode with a protective oxide layer is a first formed electrode in the stack (i.e., the bottom electrode), then it can be first deposited as a metal layer followed by a short low-temperature anneal in oxygen. On the other hand, if an inert electrode is the last electrode formed in the stack (i.e., the top electrode), then its deposition can be initiated in the oxygen environment (e.g., sputtering in an oxygen-containing plasma) to form an initial oxide sub-layer followed by deposition in an inert environment to form the remaining metal (and oxygen free) portion of the electrode.

A reactive electrode can made from a material that reacts with oxygen to form a non-conductive oxide. Some examples of suitable materials include aluminum, titanium, tantalum, chromium, praseodymium, molybdenum, tungsten, and niobium.

A precursor layer may be made from materials, such as tantalum oxide ($Ta_2O_5$), niobium oxide ($Nb_2O_5$), titanium oxide ($TiO_2$), hafnium oxide ($HfO_2$), strontium titanate ($SrTiO_3$), or other suitable transition metal oxides, perovskite manganites, or rare earth oxides. The precursor layer may include a stoichiometric oxide or near-stoichiometric oxide. For example, oxygen vacancies in the precursor layer may have a concentration of less than 0.1 atomic percent prior to its annealing.

Annealing may be performed on a fully formed stack including two electrodes and precursor layer or a partially formed stack that includes only one electrode (the second electrode is formed after the annealing). Other types of layers may also be present in these stacks. As stated above, annealing can be performed at relatively mild conditions to achieve better control over oxygen diffusion between one or more reactive layers and precursor layer. Annealing may form a graded composition of oxygen vacancies in the precursor layer.

The resistive switching layer changes its resistive state when a certain switching voltage (e.g., a set voltage or a reset voltage) is applied to this layer as further explained below. The applied voltage causes localized heating within the layer and/or at one of both of its interfaces with other components. Without being restricted to any particular theory, it is believed that a combination of the electrical field and localized heating (both created by the applied voltage) causes formation and breakage of various conductive paths within the resistive switching layer and/or at its interfaces. These conductive paths may be established and broken by moving defects (e.g., oxygen vacancies) within the resistive switching layer and through one or more interfaces that resistive switching layer forms with adjacent layers.

The interfaces can be inert interfaces or reactive interfaces. The inert interface generally does not have any substantial defect transfer through this interface. While the defects may be present within one or both layers forming this interface, these defects are not exchanged through the inert interface when switching, reading, or other types of voltages are applied to the ReRAM cell. The reactive interface generally experiences a transfer of defects through this interface. When a resistive switching layer includes an oxygen containing material, such as metal oxides, the reactive interface is formed by an oxygen reactive material, such as titanium. The inert interface may be formed by a material that is not oxygen reactive, which may be a part of an electrode or a diffusion barrier layer. In some embodiments, the flux of defects through the reactive interface is at two or more orders of magnitude greater than the flux of defects through the inert interface. As such, the "inert" and "reactive" naming convention is relative.

The inert interface provides a control for the resistive switching layer while defects are moved in and out of the resistive switching layer through the reactive interface. For example, when a switching voltage is applied to the resistive switching layer in order to reduce its resistance, the reactive interface allows defects to flow into the layer. The defects are typically driven by the electrical potential applied to the layer and form conductive paths through the layer. The direction of this flow may be determined by the polarity of the switching voltage and/or by the electrical charge of the defects (e.g., positive charged oxygen vacancies). At the same time, the second inert interface prevents defects from escaping the layer despite the driving potential. If both interfaces are reactive and allow defects to pass through, then the resistive switching layer may gain defects at one interface and loose at another. In this situation, the layer may never be able to gain enough defects to form conductive paths.

The above scenario is applicable in a very similar manner to a resetting operation during which the resistive switching layer is brought to its high resistance state. When a switching voltage is applied to the layer in order to increase its resistance of the layer, the reactive interface allows defects to flow out of the layer. The defects may also be driven by the electrical potential applied to the layer as described above. The loss of defects may eventually break conductive paths in the layer. At the same time, the second inert interface prevents defects from entering the layer despite the driving potential. If both interfaces are reactive and allow defects to pass through during the resetting operation, then the resistive switching layer may gain defects at one interface and loose at another. In this situation, the layer may never be able to lose enough defects in order to break it conductive paths. It should be noted that defects are often mobile in many times of resistive switching materials.

The ability of an interface to block defects (as in the inert interface) or to allow defects to diffuse through the interface (as in the reactive interface) depends on properties of a layer forming this interface together with the resistive switching layer. Often conductive electrodes are used to form both reactive and inert interfaces. These electrodes may be referred to as reactive and inert electrodes and materials used to form these electrodes may be referred to as reactive and inert materials. It should be noted that this terminology (i.e., reactive and inert) refers to primarily to defect mobility properties of the interfaces. Some examples of inert electrode materials include doped polysilicon, platinum, ruthenium, ruthenium oxide, gold, iridium, coppers, silver, and tungsten. Examples of reactive electrode materials include titanium. Furthermore, some materials may be defined as semi-inert including tantalum nitride, tantalum silicon nitride, and tungsten silicon nitride. In the context of oxygen containing resistive switching materials, such as metal oxides, reactive materials may be also referred to as oxygen reaction materials since oxygen or oxygen vacancies are exchanged through the reactive interface. Titanium nitride is one example of oxygen reactive materials, however other example may be used as well.

A brief description of ReRAM cells and their switching mechanisms are provided for better understanding of various features and structures associated with methods of forming nonvolatile memory elements further described below. ReRAM is a non-volatile memory type that includes dielectric material exhibiting resistive switching characteristics. A dielectric, which is normally insulating, can be made to conduct through one or more filaments or conduction paths formed after application of a sufficiently high voltage. The conduction path formation can arise from different mechanisms, including defects, metal migration, and other mechanisms further described below. Once the one or more filaments or conduction paths are formed in the dielectric component of a memory device, these filaments or conduction paths may be reset (or broken resulting in a high resistance) or set (or re-formed resulting in a lower resistance) by applying certain voltages. Without being restricted to any particular theory, it is believed that resistive switching corresponds to migration of defects within the resistive switching layer and, in some embodiments, across one interface formed by the resistive switching voltage, when a switching voltage is applied to the layer.

Figure 1B:
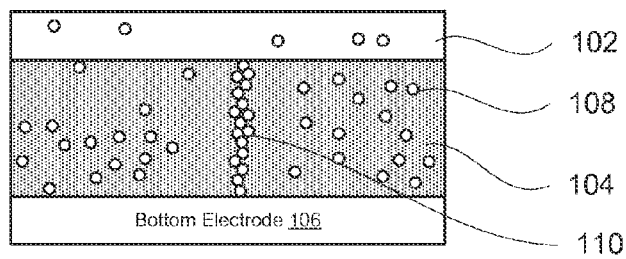
Figure 1C:
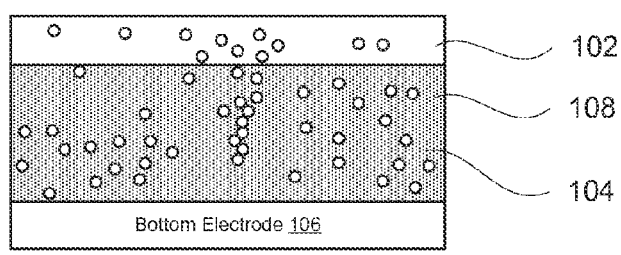

FIGS. 1A-1C illustrate a schematic representation of a ReRAM operation according to some embodiments. A basic building unit of a memory device is a stack having a capacitor like structure. A ReRAM cell includes two electrodes and a dielectric positioned in between these two electrodes. FIG. 1A illustrates a schematic representation of ReRAM cell 100 including top electrode 102, bottom electrode 106, and resistance switching layer 104 provided in between top electrode 102 and bottom electrode 106. It should be noted that the "top" and "bottom" references for electrodes 102 and 106 are used solely for differentiation and not to imply any particular spatial orientation of these electrodes. Often other references, such as "first formed" and "second formed" electrodes or simply "first" and "second", are used identify the two electrodes. ReRAM cell 100 may also include other components, such as an embedded resistor, diode, and other components. ReRAM cell 100 is sometimes referred to as a memory element or a memory unit.

Top electrode 102 and bottom electrode 106 may be used as conductive lines within a memory array or other types of devices that ReRAM cell is integrated into. As such, electrode 102 and 106 are generally formed from conductive materials. As stated above, one of the electrodes may be reactive electrode and act as a source and as a reservoir of defects for the resistive switching layer. That is, defects may travel through an interface formed by this electrode with the resistive switching layer (i.e., the reactive interface). The other interface of the resistive switching layer may be inert and may be formed with an inert electrode or a diffusion barrier layer.

Resistance switching layer 104 which may be initially formed from a dielectric material and later can be made to conduct through one or more conductive paths formed within the layer by applying first a forming voltage and then a switching voltage. To provide this resistive switching functionality, resistance switching layer 104 includes a concentration of electrically active defects 108, which may be at least partially provided into the layer during its fabrication. For example, some atoms may be absent from their native structures (i.e., creating vacancies) and/or additional atoms may be inserted into the native structures (i.e., creating interstitial defects). Charge carriers may be also introduced as dopants, stressing lattices, and other techniques. Regardless of the types all charge carriers are referred to as defects 108.

In some embodiments, these defects may be utilized for ReRAM cells operating according to a valence change mechanism, which may occur in specific transition metal oxides, nitrides, and oxy-nitrides. For example, defects may be oxygen vacancies triggered by migration of oxygen anions. Migrations of oxygen anions correspond to the motion of corresponding oxygen vacancies that are used to create and break conductive paths. A subsequent change of the stoichiometry in the transition metal oxides leads to a redox reaction expressed by a valence change of the cation sublattice and a change in the electrical conductivity. In this example, the polarity of the pulse used to perform this change determines the direction of the change, i.e., reduction or oxidation. Other resistive switching mechanisms include bipolar electrochemical metallization mechanisms and thermochemical mechanisms, which leads to a change of the stoichiometry due to a current-induced increase of the temperature. Some of these mechanisms will be further described below with reference to FIGS. 1A-1C. In the described examples, top electrode 102 is reactive, while bottom electrode 106 is inert or is separated from resistive switching layer 104 by a diffusion barrier layer (not shown). One having ordinary skills in the art would understand that other arrangements are possible as well and within the scope of this disclosure.

Specifically, FIG. 1A is a schematic representation of ReRAM cell 100 prior to initial formation of conductive paths, in accordance with some embodiments. Resistive switching layer 104 may include some defects 108. Additional defects 108 may be provided within top electrode 102 and may be later transferred to resistive switching layer 104 during the formation operation. In some embodiments, the resistive switching layer 104 has substantially no defects prior to the forming operation and all defects are provided from top electrode 102 during forming. Bottom electrode 106 may or may not have any defects. It should be noted that regardless of the presence or absence of defects in bottom electrode 106, substantially no defects are exchanged between bottom electrode 106 and resistive switching layer 104 during forming and/or switching operations.

During the forming operation, ReRAM cell 100 changes its structure from the one shown in FIG. 1A to the one shown in FIG. 1B. This change corresponds to defects 108 being arranged into one or more continuous paths within resistive switching layer 104 as, for example, schematically illustrated in FIG. 1B. Without being restricted to any particular theory, it is believed that defects 108 can be reoriented within resistance switching layer 104 to form these conductive paths 110 as, for example, schematically shown in FIG. 1B. Furthermore, some or all defects 108 forming the conductive paths may enter resistive switching layer 104 from top electrode 102. For simplicity, all these phenomena are collectively referred to as reorientation of defects within ReRAM cell 100. This reorientation of defects 108 occurs when a certain forming voltage 104 is applied to electrodes 102 and 106. In some embodiments, the forming operation also conducted at elevated temperatures to enhanced mobility of the defects within ReRAM cell 100. In general, the forming operation is considered to be a part of the fabrication of ReRAM cell 100, while subsequent resistive switching is considered to be a part of operation of ReRAM cell.

Resistive switching involves breaking and reforming conductive paths through resistive switching layer 104, i.e., switching between the state schematically illustrated in FIG. 1B and the state schematically illustrated in FIG. 1C. The resistive switching is performed by applying switching voltages to electrodes 102 and 106. Depending on magnitude and polarity of these voltages, conductive path 110 may be broken or re-formed. These voltages may be substantially lower than forming voltages (i.e., voltages used in the forming operation) since much less mobility of defects is needed during switching operations. For example, hafnium oxide based resistive layers may need about 7 Volts during their forming but can be switched using voltages less than 4 Volts.

The state of resistive switching layer 104 illustrated in FIG. 1B is referred to as a low resistance state (LRS), while the state illustrated in FIG. 1C is referred to as a high resistance state (HRS). The resistance difference between the LRS and HRS is due to different number and/or conductivity of conductive paths that exists in these states, i.e., resistive switching layer 104 has more conductive paths and/or less resistive conductive paths when it is in the LRS than when it is in the HRS. It should be noted that resistive switching layer 104 may still have some conductive paths while it is in the HRS, but these conductive paths are fewer and/or more resistive than the ones corresponding to the LRS.

When switching from its LRS to HRS, which is often referred to as a reset operation, resistive switching layer 104 may release some defects into top electrode 102. Furthermore, there may be some mobility of defects within resistive switching layer 104. This may lead to thinning and, in some embodiments, breakages of conductive paths as shown in FIG. 1C. Depending on mobility within resistive switching layer 104 and diffusion through the interface formed by resistive switching layer 104 and top electrode 102, the conductive paths may break closer to the interface with bottom electrode 106, somewhere within resistive switching layer 104, or at the interface with top electrode 102. This breakage generally does not correspond to complete dispersion of defects forming these conductive paths and may be a self limiting process, i.e., the process may stop after some initial breakage occurs.

When switching from its HRS to LRS, which is often referred to as a set operation, resistive switching layer 104 may receive some defects from top electrode 102. Similar to the reset operation described above, there may be some mobility of defects within resistive switching layer 104. This may lead to thickening and, in some embodiments, reforming of conductive paths as shown in FIG. 1B. In some embodiments, a voltage applied to electrodes 102 and 104 during the set operation has the same polarity as a voltage applied during the reset operation. This type of switching is referred to as unipolar switching. Some examples of cells that exhibit unipolar switching behavior include resistive switching layers formed from most metal oxide and having inert electrodes at both sides, e.g., Pt/MeO$_x$/Pt. Alternatively, a voltage applied to electrodes 102 and 104 during the set operation may have different polarity as a voltage applied during the reset operation. This type of switching is referred to as bipolar switching. Some examples of cells that exhibit bipolar switching behavior include resistive switching layers formed from MeOx having one inert electrode and one reactive electrode, e.g., TiN/MeOx/Pt and TiN/MeOx/poly-Si. Setting and resetting operations may be repeated multiple times as will now be described with reference to FIGS. 2A and 2B.

Figure 2A:
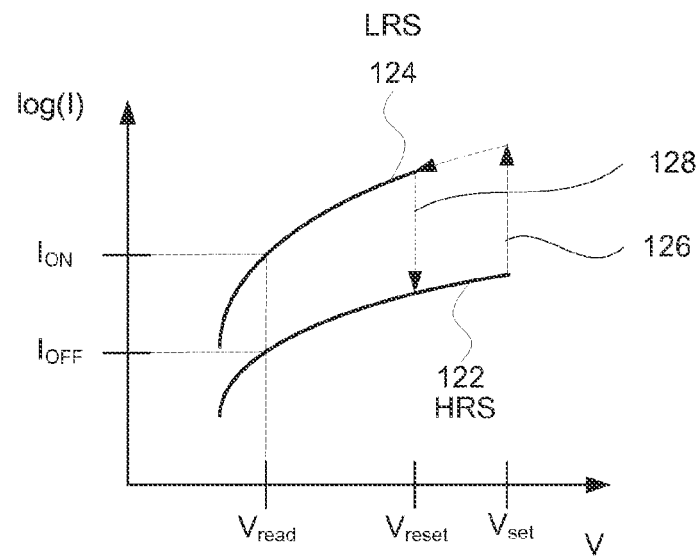
FIG. 2A illustrates a plot of a current passing through a unipolar ReRAM cell as a function of a voltage applied to the ReRAM cell, in accordance with some embodiments.
Figure 2B:
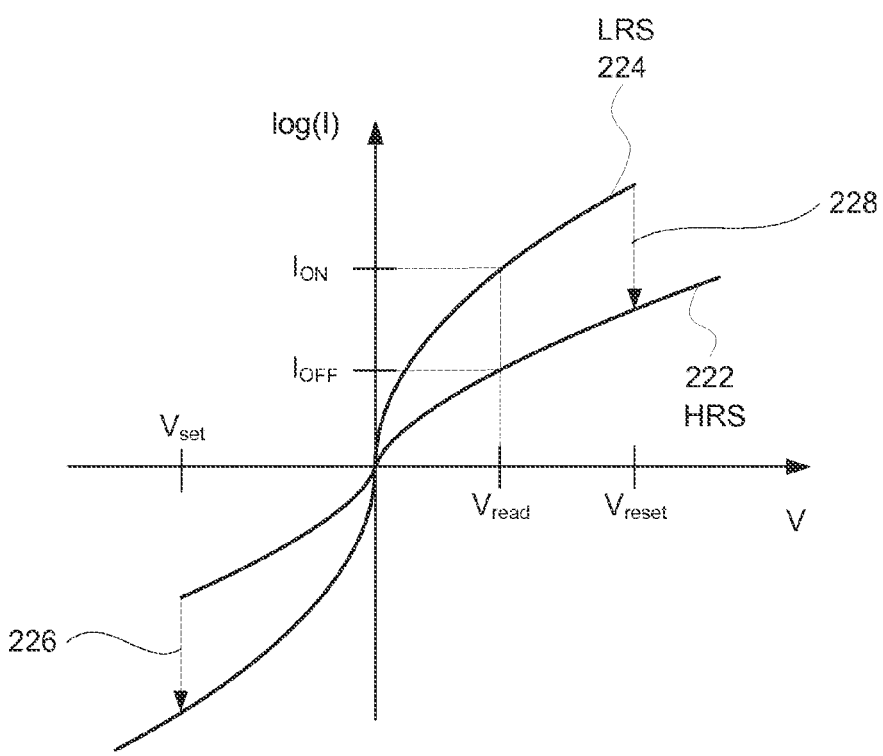
FIG. 2B illustrates the same type of a plot for a bipolar ReRAM cell, in accordance with some embodiments.

FIG. 2A illustrates a plot of a current passing through a unipolar ReRAM cell as a function of a voltage applied to the ReRAM cell, in accordance with some embodiments. FIG. 2B illustrates the same type of a plot for a bipolar ReRAM cell, in accordance with some embodiments. The HRS is defined by line 122, while the LRS is defined by 124 in FIG. 2A and by lines 222 and 224 respectively in FIG. 2B. Each of these states is used to represent a different logic state, e.g., the HRS may represent logic one ("1") and LRS representing logic zero ("0") or vice versa. Therefore, each ReRAM cell that has two resistance states may be used to store one bit of data. It should be noted that some ReRAM cells may have three and even more resistance states allowing multi-bit storage in the same cell.

The overall operation of the ReRAM cell may be divided into a read operation, set operation (i.e., turning the cell "ON" by changing from its HRS to LRS), and reset operation (i.e., turning the cell "OFF" by changing from its LRS to HRS). During the read operation, the state of the ReRAM cell or, more specifically, the resistive state of its resistance of resistance switching layer can be sensed by applying a sensing voltage to its electrodes. The sensing voltage is sometimes referred to as a "READ" voltage or simply a reading voltage and indicated as $V_{READ}$ in FIGS. 2A and 2B. If the ReRAM cell is in its HRS (represented by line 122 in FIGS. 2A and 2B), the external read and write circuitry connected to the electrodes will sense the resulting "OFF" current ($I_{OFF}$) that flows through the ReRAM cell. As stated above, this read operation may be performed multiple times without changing the resistive state (i.e., switching the cell between its HRS and LRS). In the above example, the ReRAM cell should continue to output the "OFF" current ($I_{OFF}$) when the read voltage ($V_{READ}$) is applied to the electrodes for the second time, third time, and so on.

Continuing with the above example, when it is desired to turn "ON" the cell that is currently in the HRS switch, a set operation is performed. This operation may use the same read and write circuitry to apply a set voltage ($V_{SET}$) to the electrodes. Applying the set voltage forms one or more conductive paths in the resistance switching layer as described above with reference to FIGS. 1B and 1C. The switching from the HRS to LRS is indicated by dashed line 126 in FIGS. 2A and 2B. The resistance characteristics of the ReRAM cell in its LRS are represented by line 124. When the read voltage ($V_{READ}$) is applied to the electrodes of the cell in this state, the external read and write circuitry will sense the resulting "ON" current ($I_{ON}$) that flows through the ReRAM cell. Again, this read operation may be performed multiple times without switching the state of the ReRAM cell.

At some point, it may be desirable to turn "OFF" the ReRAM cell by changing its state from the LRS to HRS. This operation is referred to as a reset operation and should be distinguished from set operation during which the ReRAM cell is switched from its HRS to LRS. During the reset operation, a reset voltage ($V_{RESET}$) is applied to the ReRAM cell to break the previously formed conductive paths in the resistance switching layer. Switching from a LRS to HRS is indicated by dashed line 128 in FIG. 2A and line 228. Detecting the state of the ReRAM cell while it is in its HRS is described above.

It should be noted that polarity of the reset voltage and the set voltage may be the same as shown in FIG. 2A or different as shown in FIG. 2B. The cells that have the same polarity of set and reset voltages are referred to as unipolar cells, while the cells that have different polarities of h set and reset voltages are referred to as bipolar cells. Without being restricted to any particular theory, it is believed that unipolar switching occurs due to metallic filament formation and destruction caused by resistive heating and application of electrical field. Bipolar switching is believed to be based on filaments formed from oxygen vacancies. The formation and rupture of filament is done by oxygen vacancy moving back and forth. The switching voltages of unipolar and bipolar switching are typically comparable. However, the endurance of bipolar is generally better than that of unipolar.

Overall, the ReRAM cell may be switched back and forth between its LRS and HRS many times. Read operations may be performed in each of these states (between the switching operations) one or more times or not performed at all. It should be noted that application of set and reset voltages to change resistance states of the ReRAM cell involves complex mechanisms that are believed to involve localized resistive heating as well as mobility of defects impacted by both temperature and applied potential.

In some embodiments, the set voltage ($V_{SET}$) is between about 100 mV and 10V or, more specifically, between about 500 mV and 5V. The length of set voltage pulses ($t_{SET}$) may be less than about 100 milliseconds or, more specifically, less than about 5 milliseconds and even less than about 100 nanoseconds. The read voltage ($V_{READ}$) may be between about 0.1 and 0.5 of the write voltage ($V_{SET}$). In some embodiments, the read currents ($I_{ON}$ and $I_{OFF}$) are greater than about 1 mA or, more specifically, is greater than about 5 mA to allow for a fast detection of the state by reasonably small sense amplifiers. The length of read voltage pulse ($t_{READ}$) may be comparable to the length of the corresponding set voltage pulse ($t_{SET}$) or may be shorter than the write voltage pulse ($t_{RESET}$). ReRAM cells should be able to cycle between LRS and HRS between at least about $10^3$ times or, more specifically, at least about $10^7$ times without failure. A data retention time ($t_{RET}$) should be at least about 5 years or, more specifically, at least about 10 years at a thermal stress up to 85° C. and small electrical stress, such as a constant application of the read voltage ($V_{READ}$). Other considerations may include low current leakage, such as less than about 40 A/cm² measured at 0.5 V per 20 Å of oxide thickness in HRS.

In some embodiments, the same ReRAM cell may include two or more resistance switching layers interconnected in series. Adjacent resistance switching layers may directly interface each other or be separated by an intermediate layer.

The ReRAM cells can be configured in a cross point memory array. The cross point memory arrays can include horizontal word lines that cross vertical bit lines. Memory cells can be located at the cross points of the word lines and the bit lines. The memory cells can function as the storage elements of a memory array.

Figure 3:
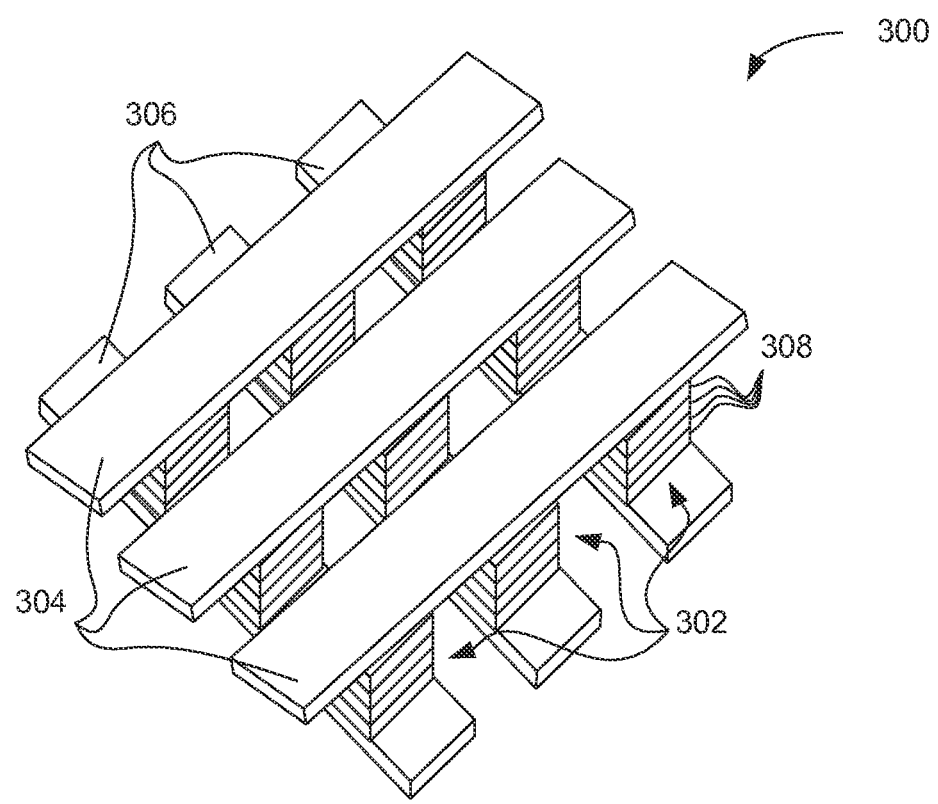
FIG. 3 illustrates a memory array of resistive switching memory elements according to some embodiments.

FIG. 3 illustrates a memory array of resistive switching memory elements according to some embodiments. Memory array 300 may be part of a memory device or other integrated circuit. Memory array 300 is an example of potential memory configurations; it is understood that several other configurations are possible.

Read and write circuitry may be connected to memory elements 302 using signal lines 304 and orthogonal signal lines 306. Signal lines such as signal lines 304 and signal lines 306 are sometimes referred to as word lines and bit lines and are used to read and write data into the elements 302 of array 300. Individual memory elements 302 or groups of memory elements 302 can be addressed using appropriate sets of signal lines 304 and 306. Memory element 302 may be formed from one or more layers 308 of materials, as is described in further detail below. In addition, the memory arrays shown can be stacked in a vertical fashion to make multi-layer 3-D memory arrays.

Any suitable read and write circuitry and array layout scheme may be used to construct a non-volatile memory device from resistive switching memory elements such as element 302. For example, horizontal and vertical lines 304 and 306 may be connected directly to the terminals of resistive switching memory elements 302. This is merely illustrative.

During the operation of the cross point memory array, such as a read operation, the state of a memory element 302 can be sensed by applying a sensing voltage (i.e., a "read" voltage) to an appropriate set of signal lines 304 and 306. Depending on its history, a memory element that is addressed in this way may be in either a high resistance state or a low resistance state. The resistance of the memory element therefore determines what digital data is being stored by the memory element. If the memory element has a low resistance, for example, the memory element may be said to contain a logic one (i.e., a "1" bit). If, on the other hand, the memory element has a high resistance, the memory element may be said to contain a logic zero (i.e., a "0" bit). During a write operation, the state of a memory element can be changed by application of suitable write signals to an appropriate set of signal lines 304 and 306.

Ideally, only the selected memory cell, e.g., during a read operation, can experience a current. However, currents, often referred as sneak path currents, can flow through unselected memory elements during the read operation. The sensing the resistance state of a single memory call can be unreliable. For example, all memory cells in the array are coupled together through many parallel paths. The resistance measured at one cross point can include the resistance of the memory cell at that cross point in parallel with resistances of the memory cells in the other rows and columns.

Figure 4:
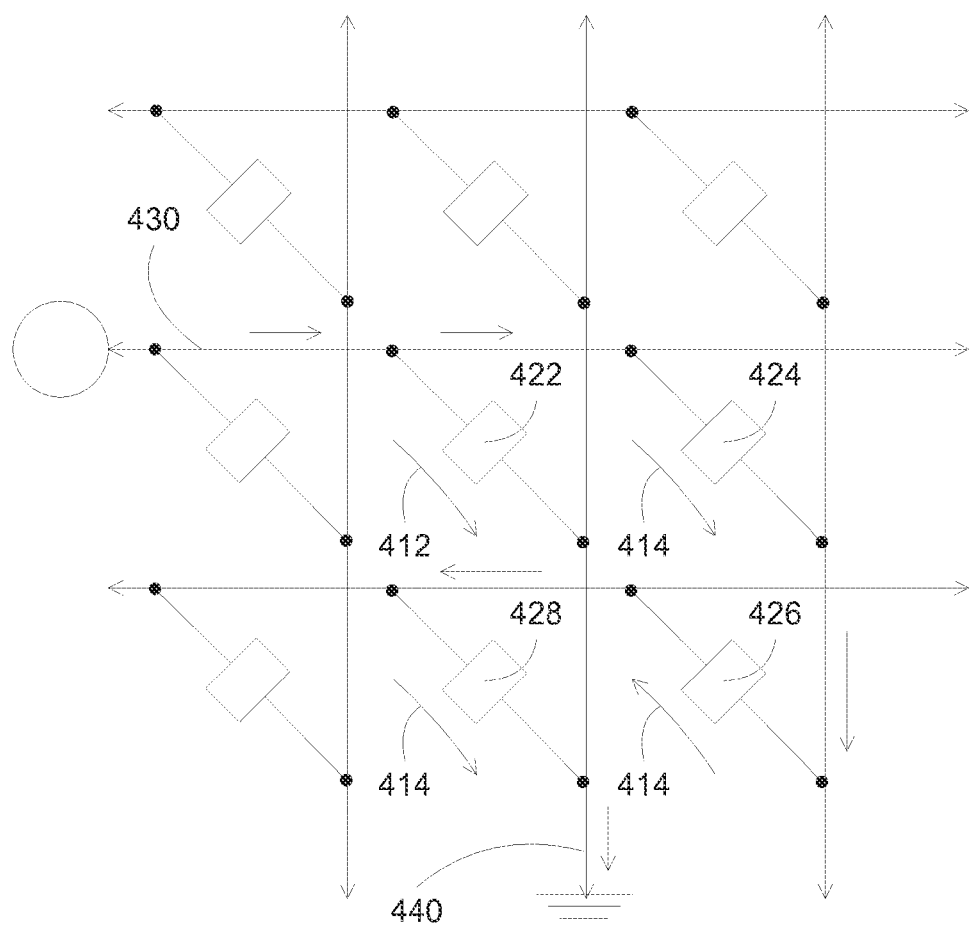
FIG. 4 illustrates sneak path currents in a cross point memory array according to some embodiments.

FIG. 4 illustrates sneak path currents in a cross point memory array according to some embodiments. A memory cell 422 can be selected, for example, for a read operation, by applying a voltage to signal line 430, and grounding signal line 440. A current can flow through the memory cell 422. However, parallel current paths, e.g., sneak path current, can exist, for example, represented by a series of memory cells 424, 426, and 428. The applied voltage (signal line 430) can generate a current 414 through memory cell 424, passing through memory cell 426, and returning to the ground (signal line 440) through memory cell 428.

There are multiple sneak path currents, and the resistances of the series memory cells can be smaller than that of the selected memory cell, thus can obscure the sense current through the selected memory cell during a read operation.

To reduce or eliminate the sneak path occurrence, a control device, e.g., a selector, can be used in the cross point memory array. For example, a series transistor or a diode can be located in a memory cell. The control device can isolate the selected memory cell from unselected memory cells by breaking parallel connections of the memory cells.

Figure 5:
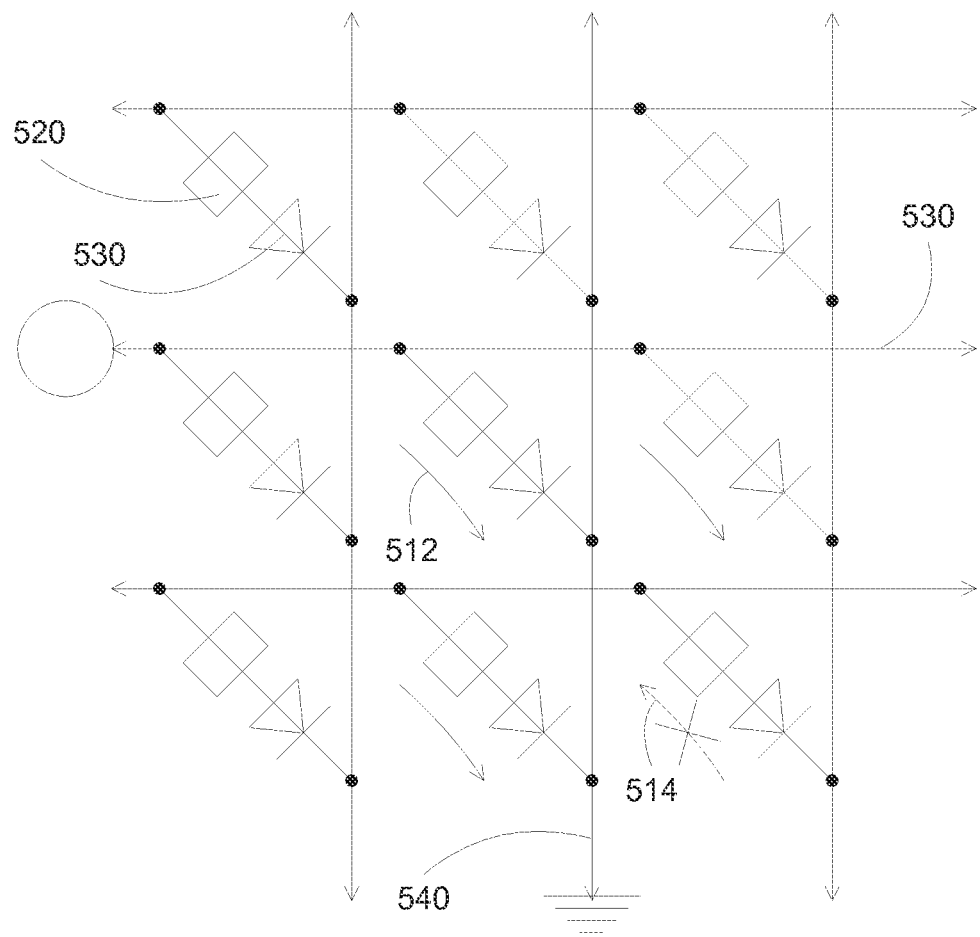
FIG. 5 illustrates a cross point memory array according to some embodiments.

FIG. 5 illustrates a cross point memory array according to some embodiments. A switching memory device can include a memory element 520 and a diode selector 530, which are both disposed between the electrodes 530 and 540. The diode selector 530 can be an intervening electrical component, disposed between electrode 530 and memory element 520, or between the electrode 540 and memory element 520. In some embodiments, the diode selector 530 may include two or more layers of materials that are configured to allow or inhibit the current flow in different directions through the memory element 520 when that memory element is not selected to read. For example, the diode selector can prevent a sneak path current 514 when the sense current 512 is generated.

In some embodiments, a metal-insulator-metal capacitor (MIMCAP) diode is provided that can function as a diode selector that can be suitable for memory device applications. The MIMCAP diode can have lower thermal budget as compared to Schottky diodes and controllable lower barrier height and lower series resistance as compared to MIMCAP tunneling diodes, which utilizes a tunneling effect through the insulator layer.

In some embodiments, the MIMCAP diode can include a barrier height modification layer, a low leakage dielectric layer and a high leakage dielectric layer. The layers can be sandwiched between two electrodes.

Figure 6A:
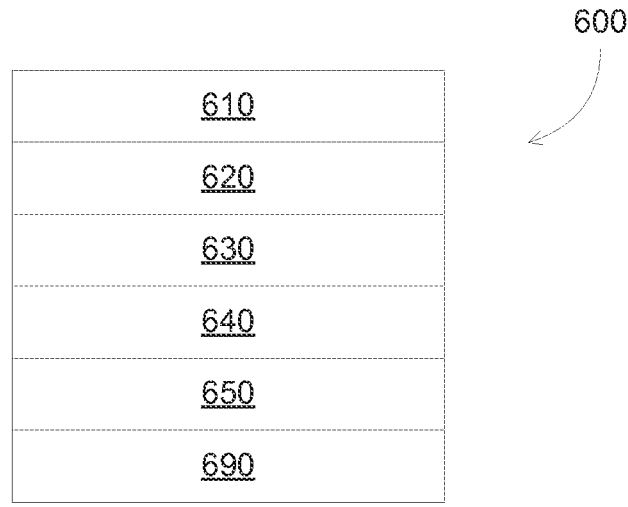
FIGS. 6A-6B illustrate an example of a MIMCAP diode together with a memory stack incorporating the MIMCAP diode according to some embodiments.
Figure 6B:
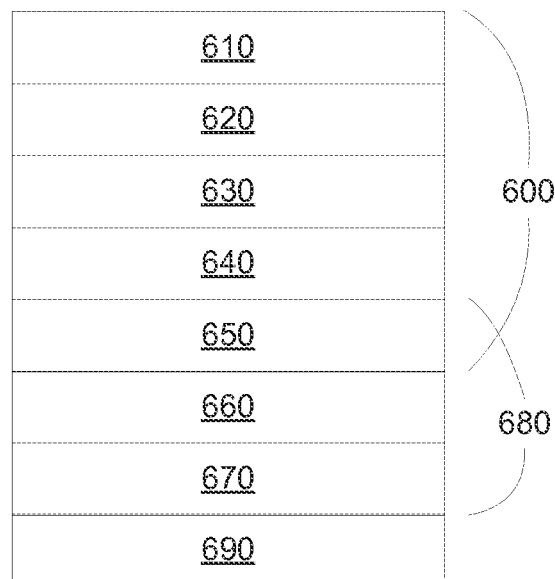

FIGS. 6A-6B illustrate an example of a MIMCAP diode together with a memory stack incorporating the MIMCAP diode according to some embodiments. In FIG. 6A, a MIMCAP diode 600 can be disposed on a substrate 690, and can include a dielectric barrier height modification layer 620, a low leakage dielectric layer 630, and a high leakage dielectric layer 640, sandwiched between two electrodes 610 and 650. As shown, the MIMCAP diode 600 includes the barrier height modification layer 620 disposed on the low leakage layer 630, which is disposed on the high leakage layer 640. However, other configurations can be used, such as the barrier height modification layer 620 disposed on the high leakage layer 640, which is disposed on the low leakage layer 630; the low leakage layer 630 disposed on the high leakage layer 640, which is disposed on the barrier height modification layer 620; or the high leakage layer 640 disposed on the low leakage layer 630, which is disposed on the barrier height modification layer 620.

In FIG. 6B, a MIMCAP diode 600 can be placed in series with a memory element 680, which is disposed on a substrate 690. The memory element can include a switching layer 660 sandwiched between two electrodes 650 and 670. As shown, the MIMCAP diode 600 and the memory element 680 share a common electrode 650.

In some embodiments, the barrier height modification layer can function to change the barrier height at one electrode of the MIMCAP diode. For example, the barrier height modification layer can provide a MIMCAP structure that has an asymmetric barrier energy band. The barrier height modification layer can include a dielectric layer that has a different band gap, e.g., larger band gap or smaller band gap, than the adjacent dielectric layer, such as the low leakage current layer or the high leakage current layer.

In some embodiments, the barrier height modification layer can decouple the properties of the electrodes. For example, an electrode can be selected based on the fabrication process, together with the device characteristics and performance. The electrode might or might not have a correct Schottky barrier height. The barrier height modification layer can supply the barrier height matching property, allowing a wider selection of electrode materials and process conditions.

Current passing through the Schottky junction can depend on the barrier height. Generally, smaller leakage current occurs for higher barrier height. Thus the barrier height modification layer can be included to reduce the leakage current in a reverse bias of the MIMCAP diode. The barrier height can be modified by introducing dipole moments, carriers or ions into a dielectric layer, for example, to create an additional electric field. Alternatively, the use of a thin layer of certain materials can alter the barrier height. For example, dielectric layer having larger band gap than the adjacent layer (e.g., the low leakage current layer or the high leakage current layer) can be used. The barrier height modification layer can include AlOx, AlN, doped ZrOx or doped HfOx, $SiO_2$, SiN. The thickness of the barrier height modification layer can be between 1 and 5 nm, or can be between 1 and 3 nm.

Figure 7A:
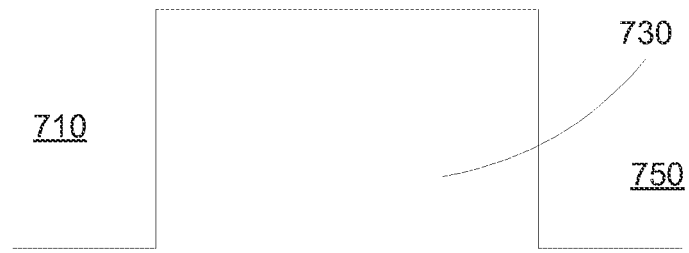
FIGS. 7A-7C illustrate an example of a band diagram for a barrier height modification layer according to some embodiments.
Figure 7B:
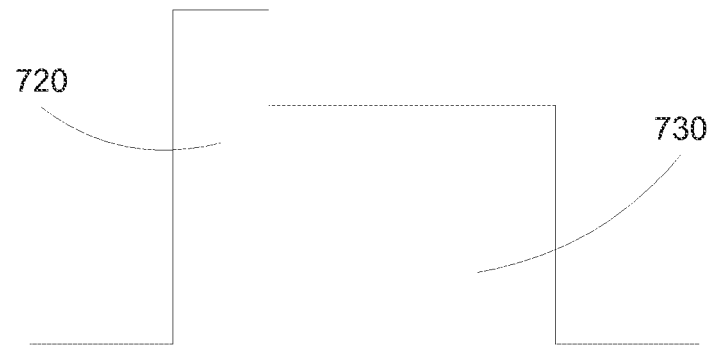
Figure 7C:
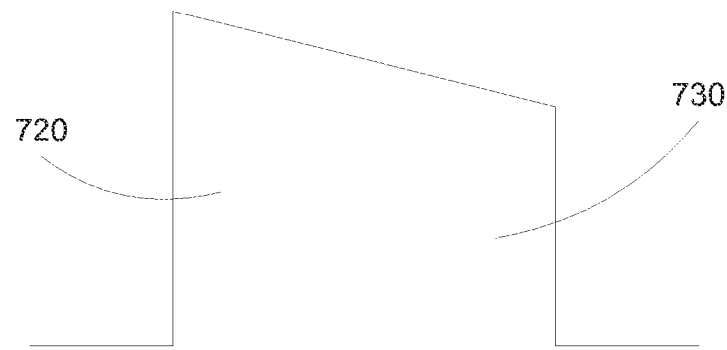

FIGS. 7A-7C illustrate an example of a band diagram for a barrier height modification layer according to some embodiments. The barrier height modification layer can serve to form a slope of an energy band for the dielectric layer between two electrodes. In FIG. 7A, a dielectric layer 730 is sandwiched between two electrodes 710 and 750. The band diagram shows the Fermi levels of the two electrodes 710 and 750 and the electron portion of the band gap of the dielectric layer 730. As shown, the two electrodes can have similar material, and thus the Fermi levels can be the same, resulting in a level energy band for the dielectric layer.

In FIG. 7B, a barrier height modification layer 720 is introduced between the electrode 710 and the dielectric layer 730. The barrier height modification layer 720 can have a higher energy level (e.g., higher conduction band minimum of the band gap) than that of the dielectric layer 730. Therefore, after reaching equilibrium, the energy band can form a slope within the dielectric layers 720 and 730 between the two electrodes 710 and 750 (see FIG. 7C). The above description is schematic and illustrative, served only to show a possible effect of the barrier height modification layer 720.

Figure 8A:
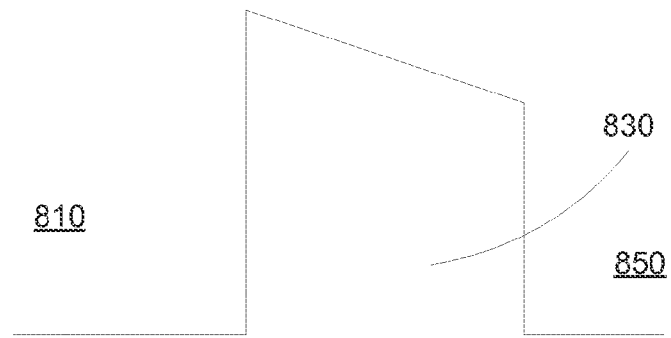
FIGS. 8A-8C illustrate an example of a band diagram for a barrier height modification layer according to some embodiments.
Figure 8B:
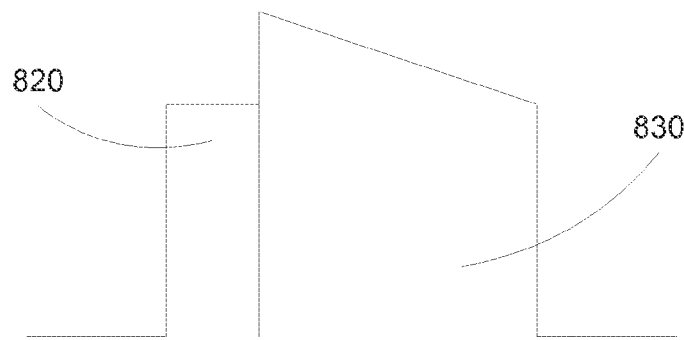
Figure 8C:
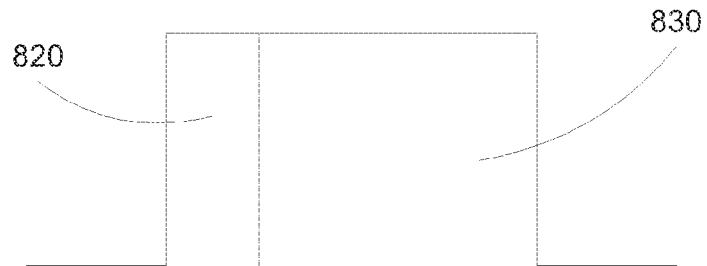

FIGS. 8A-8C illustrate an example of a band diagram for a barrier height modification layer according to some embodiments. The barrier height modification layer can serve to change a slope of an energy band for the dielectric layer between two electrodes. In FIG. 8A, a dielectric layer 830 is sandwiched between two electrodes 810 and 850. The band diagram shows the Fermi levels of the two electrodes 810 and 850 and the electron portion of the band gap of the dielectric layer 830. As shown, the two electrodes can have different materials (e.g., having different band gaps), and at equilibrium, the Fermi levels can be aligned, resulting in a sloped energy band for the dielectric layer.

In FIG. 8B, a barrier height modification layer 820 is introduced between the electrode 810 and the dielectric layer 830. The barrier height modification layer 820 can have a lower energy level (e.g., lower conduction band minimum of the band gap) than that of the dielectric layer 830. Therefore, after reaching equilibrium, the energy band can be leveled within the dielectric layers 820 and 830 between the two electrodes 810 and 850 (see FIG. 8C). The above description is schematic and illustrative, served only to show a possible effect of the barrier height modification layer 820.

In some embodiments, the low leakage dielectric layer can function to restrict the current flow across the MIMCAP diode, especially in the reverse bias condition. The leakage of the low leakage dielectric layer can be optimized to not significantly affect the current flow during the forward bias, and to significantly limit the current flow during the reverse bias. The low leakage dielectric layer can include ZrOx, HfOx, doped ZrOx or doped HfOx. The thickness of the low leakage dielectric layer can be between 3 and 10 nm. In some embodiments, the low leakage dielectric layer can have a leakage current density less than $10^{-5}$ $A/cm^2$, or $10^{-6}$ $A/cm^2$.

In some embodiments, the high leakage dielectric layer can function to enhance the current flow across the MIMCAP diode, especially at the forward bias condition. The leakage of the high leakage dielectric layer can be optimized to allow high current flow during the forward bias while not provide current flow during the reverse bias. The high leakage dielectric layer can include ZrOx, HfOx, TiOx, NbOx, or ZnO. The thickness of the low leakage dielectric layer can be between 3 and 10 nm. In some embodiments, the low leakage dielectric layer and the high leakage dielectric layer are interdependent, wherein the combination of these two layers can enhance the diode characteristics of the MIMCAP diode, providing high current flow during forward bias and negligible current flow during reverse bias. In some embodiments, the high leakage dielectric layer can have a leakage current density higher than $10^3$ A/cm$^2$, or $10^4$ A/cm$^2$. In some embodiments, the high leakage dielectric layer can have a leakage current higher than that of the low leakage dielectric layer.

Figure 9A:
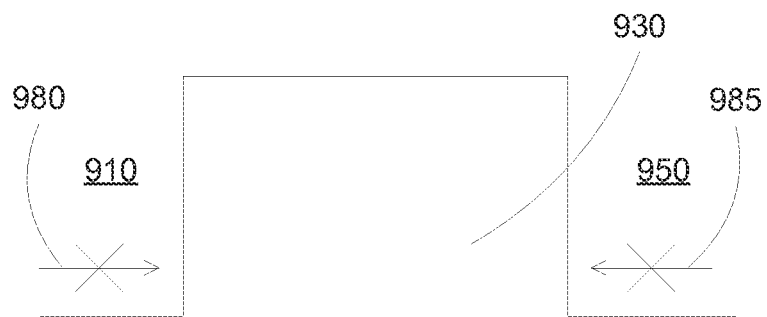
FIGS. 9A-9B illustrate examples of band diagrams for low and high leakage dielectric layers according to some embodiments.
Figure 9B:
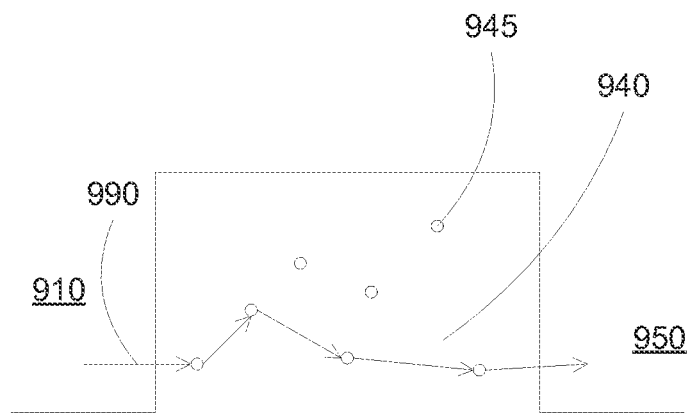

FIGS. 9A-9B illustrate examples of band diagrams for low and high leakage dielectric layers according to some embodiments. In FIG. 9A, a low leakage dielectric layer 930 is sandwiched between two electrodes 910 and 950. There is no leakage current, or only minimum leakage current, for example, leakage currents 980 or 985, through the low leakage dielectric layer 930. In some embodiments, the low leakage dielectric layer 930 can be characterized as having a leakage current density of less than $10^{-5}$ A/cm$^2$, or $10^{-6}$ A/cm$^2$, depending on the device design.

In FIG. 9B, a high leakage dielectric layer 940 is sandwiched between two electrodes 910 and 950. The high leakage dielectric layer 940 can include defects 945, which can allow current 990 to travel across the dielectric layer 940. The leakage current can be distinguished from tunneling current, and thus the high leakage current is not limited by the tunnel thickness, e.g., the thickness of the high leakage dielectric layer can be higher than the tunneling thickness, such as between 3 and 10 nm. In some embodiments, the high leakage dielectric layer 940 can be characterized as having a leakage current density of higher than $10^3$ A/cm$^2$, or $10^4$ A/cm$^2$, depending on the device design.

The MIMCAP diode can function as a diode, e.g., having asymmetric current behavior with respect to the applied voltage polarities. For example, at forward bias, there can be higher current through the MIMCAP diode as compared to the current at a same voltage at reverse bias.

Figure 10A:
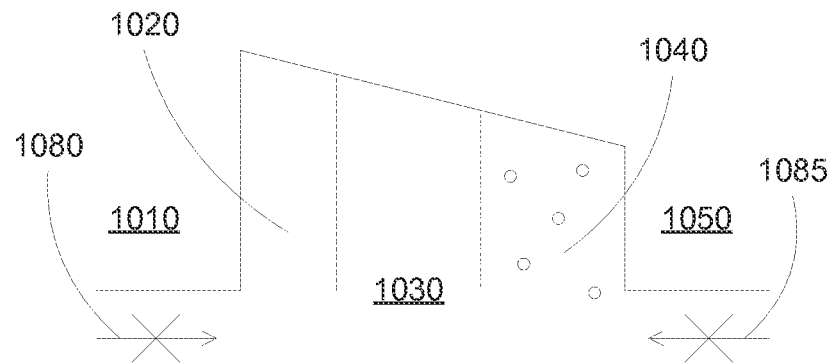
FIGS. 10A-10C illustrates a schematic of the operation of the MIMCAP diode according to some embodiments.
Figure 10B:
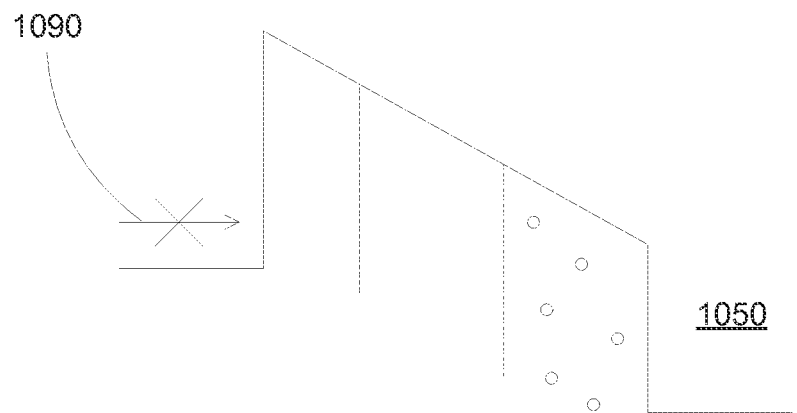
Figure 10C:
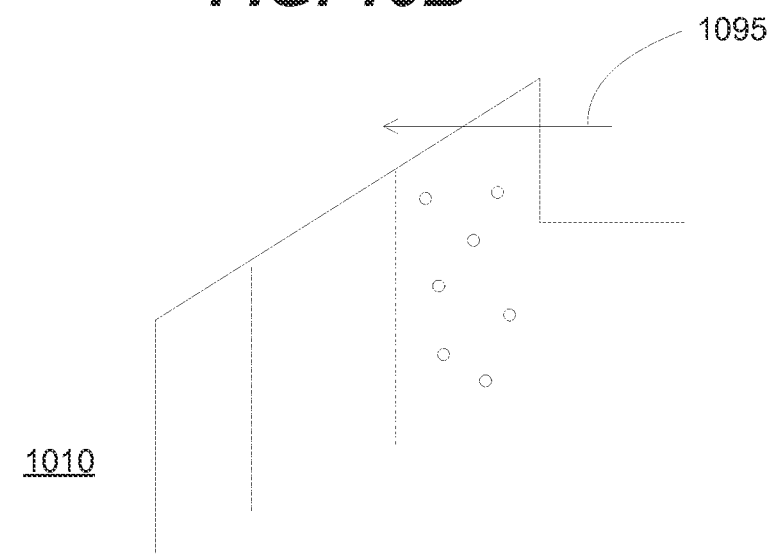

FIGS. 10A-10C illustrates a schematic of the operation of the MIMCAP diode according to some embodiments. The explanation serves as an illustration, and does not mean to bind the disclosure to any particular theory.

In FIG. 10A, the MIMCAP diode can include a barrier height modification layer 1020, a low leakage current dielectric layer 1030, and a high leakage current dielectric layer 1040. The MIMCAP diode can be positioned between electrodes 1010 and 1050. The barrier height modification layer 1020 can form an energy level profile for the MIMCAP diode, regardless of the electrodes 1010 and 1050. The energy band shown includes the Fermi levels for the electrodes, and the electron portion of the band diagram for the MIMCAP diode. The high leakage dielectric layer 1040 can include electron defects, e.g., defects that can allow electrons to pass through the high leakage dielectric layer 1040. As shown, the MIMCAP diode is in equilibrium, having the Fermi levels for the two electrodes to be at the same level. The energy level for the MIMCAP diode shows a slope profile, but any other profiles can be used. Under no applied voltage, there are no currents 1080 or 1085 (or only minimum leakage currents) passing through the MIMCAP diode in either direction, since the low leakage dielectric layer 1030 dominates the leakage currents.

In FIG. 10B, a reverse bias is applied to the MIMCAP diode. For example, a positive voltage can be applied to the electrode 1050, lowering the Fermi level of the electrode 1050. There is no current 1090 (or only minimum leakage current) passing through the MIMCAP diode in the reverse bias, since the electrons can be blocked by the Schottky barrier and the low leakage dielectric layer 1030.

In FIG. 10C, a forward bias is applied to the MIMCAP diode. For example, a positive voltage can be applied to the electrode 1010, lowering the Fermi level of the electrode 1010. Alternatively, a negative voltage can be applied to the electrode 1050, raising the Fermi level of the electrode 1050. There can be high currents 1095 passing through the MIMCAP diode in the forward bias, since the electrons can pass through the high leakage dielectric layer 1040, and travel to the electrode 1010. Similar behaviors can be seen for hole conduction. The explanation is illustrative. Specific operations of the MIMCAP diode can depend on the materials, the properties, and the process conditions of the device.

In some embodiments, methods to form MIMCAP diode can be provided. The methods can include depositing the barrier height modification layer, the low leakage dielectric layer, and the high leakage dielectric layer, together with optionally performing treatments after each layer. The treatment can include rapid thermal annealing or plasma treatment, such as a rapid thermal anneal in temperatures between 200 and 400 C, plasma oxygen anneal, and/or in-situ annealing after deposition. The treatments can modify the deposited layers to achieve the desired diode characteristics.

Figure 11:
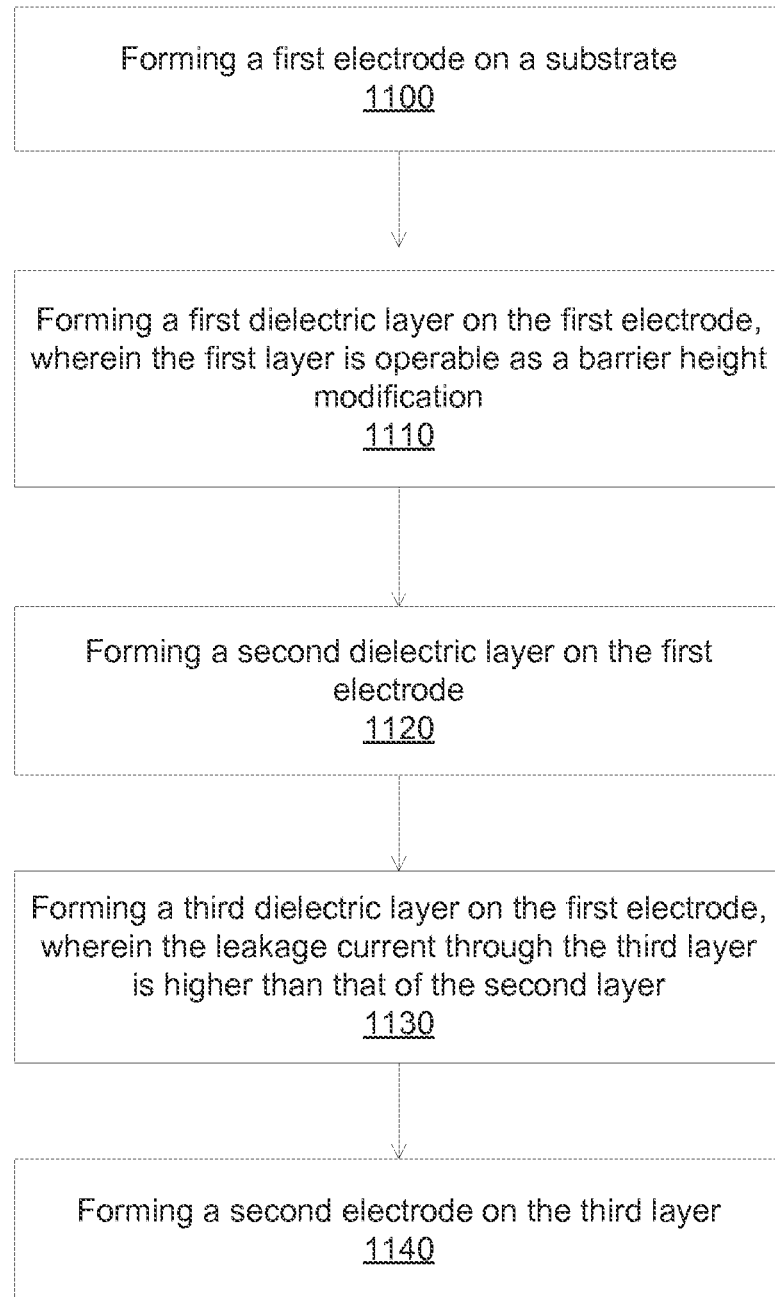
FIG. 11 illustrates a flowchart for forming a MIMCAP diode according to some embodiments.

FIG. 11 illustrates a flowchart for forming a MIMCAP diode according to some embodiments. The described flowchart is a general description of techniques used to form the MIMCAP diodes described above. The flowchart describes techniques for forming a MIMCAP diode generally including two electrodes and multiple layers disposed therebetween. Although certain processing techniques and specifications are described, it is understood that various other techniques and modifications of the techniques described herein may also be used.

In operation 1100, a first electrode layer is formed. The first electrode layer can be formed on a substrate, for example, a silicon substrate that may include one or more layers already formed thereon. In some embodiments, the first layer can be a polysilicon layer or a metal containing layer. For example, the first layer can be a highly doped polysilicon layer that is formed using a conventional CVD or ALD type polysilicon deposition technique. In some cases, an optional native oxide layer removal step may be performed after forming the first layer by use of a wet chemical processing technique, or conventional dry clean process that is performed in a plasma processing chamber. It should be noted that the first layer may be provided on a substrate that may have a resistive memory element and the electrode formed thereon as well. Alternatively, in the case where no other device is provided, the first layer can be the bottom electrode. The first electrode layer can include TiN, Ti, Al, MoO$_2$, W, poly-Si, TiSiN, TaSiN, Ni, or any combination, mixture or alloy thereof that can be formed using PVD or other processes. For example, the first electrode can be sputtered by bombarding a metal target at 150-500 W with a pressure of 2-10 mTorr for a deposition rate of approximately 0.5-5 Å/s. These specifications are given as examples, the specifications can vary greatly depending on the material to be deposited, the tool used to deposit the material, and the desired speed of deposition. The duration of the bombardment can determine the thickness of the electrode. Other processing techniques, such as ALD, PLD, PVD, CVD, evaporation, etc. can also be used to deposit the first electrode. In some embodiments, the first electrode is in contact with one of the signal lines. The first electrode may have any thickness, for example between about 5 nm and about 500 nm thick.

In operation 1110, a first dielectric layer can be formed on the first electrode. The first dielectric layer can be operable as a barrier height modification layer, e.g., having different band gap than the second dielectric layer. The first dielectric layer can include $AlO_x$, AlN, doped $ZrO_x$ or $HfO_x$, $SiO_2$, or SiN. The thickness of the first dielectric layer can be between 1 to 3 nm. An optional treatment can be performed after the first dielectric layer. The treatment can include a plasma treatment or a high temperature treatment. For example, the treatment can include a rapid thermal oxidation at 300 C in oxygen ambient. The treatment can be performed in-situ after the deposition of the first electrode layer. The treatment can include an oxygen radical anneal, e.g., plasma anneal in an oxygen ambient.

In operation 1120, a second dielectric layer can be formed on the first electrode. The second dielectric layer can be operable as a low leakage dielectric layer. The second dielectric layer can include $ZrO_x$, $HfO_x$, doped $ZrO_x$, doped $HfO_x$. The thickness of the second dielectric layer can be between 2 nm and 20 nm, or between 3 to 10 nm. An optional treatment can be performed after depositing the second dielectric layer. The treatment can include a plasma treatment or a high temperature treatment. For example, the treatment can include a rapid thermal oxidation at 300 C in oxygen ambient. The treatment can be performed in-situ after the deposition of the first electrode layer. The treatment can include an oxygen radical anneal, e.g., plasma anneal in an oxygen ambient.

In some embodiments, the low leakage dielectric layer can be deposited by a PVD or ALD process. For example, an ALD process can include $O_3$ oxidant, at about 250-300 C deposition temperature, using tetrakis(ethylmethylamino) zirconium (TEMAZ), Tris(dimethylamino)cyclopentadienyl Zirconium (ZyALD), tetrakis(ethylmethylamino) hafnium (TEMAHf), tetrakis(dimethylamido) hafnium (TDMAHf) precursors.

In operation 1130, a third dielectric layer can be formed on the first electrode. The third dielectric layer can be operable as a high leakage dielectric layer. The third dielectric layer can include $ZrO_x$, $HfO_x$, $TiO_x$, NbOx, ZnO. The thickness of the third dielectric layer can be between 2 nm and 20 nm, or between 3 to 10 nm. In some embodiments, the high leakage dielectric layer can have higher leakage current than the low leakage dielectric layer at the same applied voltage. An optional treatment can be performed after depositing the third dielectric layer. The treatment can include a plasma treatment or a high temperature treatment. For example, the treatment can include a rapid thermal oxidation at 300 C in oxygen ambient. The treatment can be performed in-situ after the deposition of the first electrode layer. The treatment can include an oxygen radical anneal, e.g., plasma anneal in an oxygen ambient.

In some embodiments, the high leakage dielectric layer can be deposited by a PVD or ALD process. For example, an ALD process can include $H_2O$ oxidant, and at less than about 200 C deposition temperature.

In operation 1140, a second electrode layer is formed on the MIMCAP diode stack. The second electrode layer can include TiN, Ti, Al, $MoO_2$, W, poly-Si, TiSiN, TaSiN, Ni, or any combination, mixture or alloy thereof that can be formed using PVD or other processes such as ALD, PLD, CVD, evaporation, etc. The second electrode may have any thickness, for example between about 5 nm and about 500 nm thick.

Figure 12:
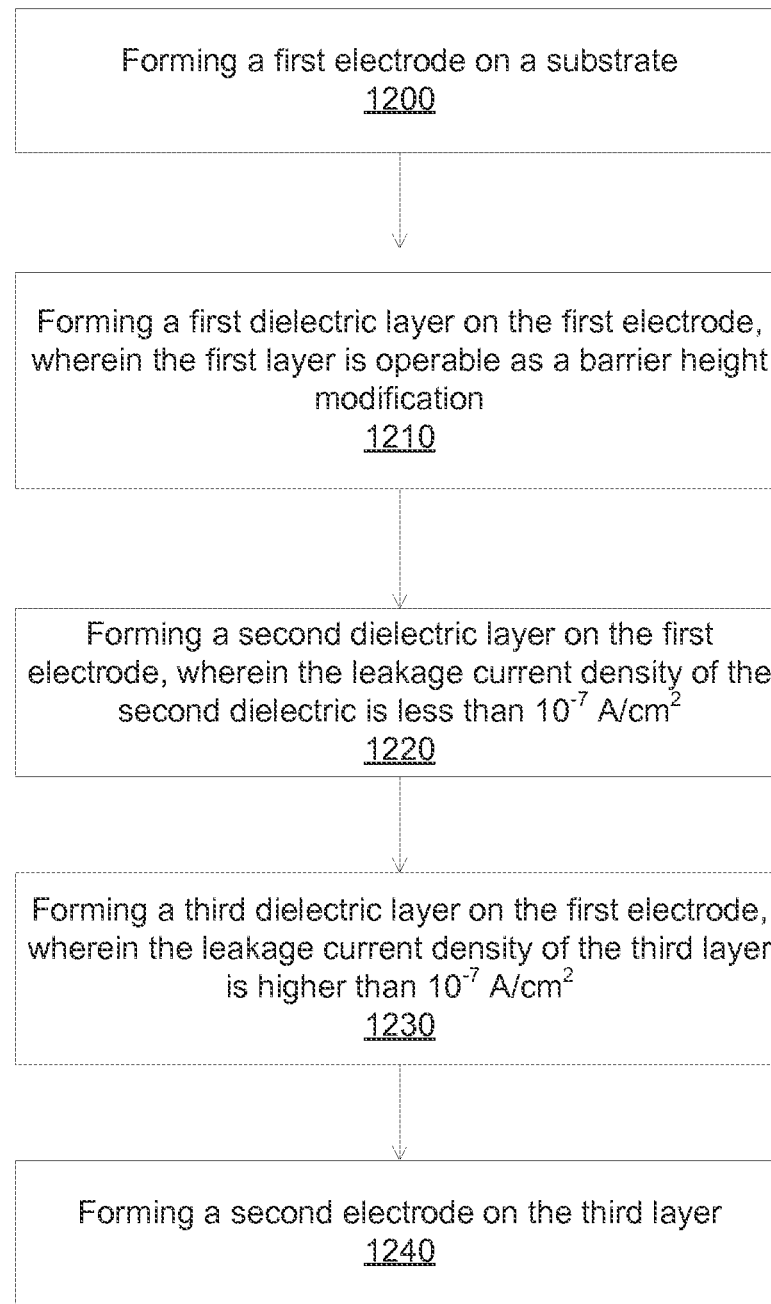
FIG. 12 illustrates a flowchart for forming a MIMCAP diode according to some embodiments.

FIG. 12 illustrates a flowchart for forming a MIMCAP diode according to some embodiments. In operation 1200, a first electrode layer is formed. The first electrode layer can be formed on a substrate, for example, a silicon substrate that may include one or more layers already formed thereon. In operation 1210, a first dielectric layer can be formed on the first electrode. The first dielectric layer can be operable as a barrier height modification layer. An optional treatment can be performed after the first dielectric layer. In operation 1220, a second dielectric layer can be formed on the first electrode. The second dielectric layer can be operable as a low leakage dielectric layer. The leakage of the second dielectric layer can be less than about $10^{-5}$ $A/cm^2$. An optional treatment can be performed after depositing the second dielectric layer. In operation 1230, a third dielectric layer can be formed on the first electrode. The third dielectric layer can be operable as a high leakage dielectric layer. The leakage of the third dielectric layer can be higher than about $10^3$ $A/cm^2$. An optional treatment can be performed after depositing the third dielectric layer. In operation 1240, a second electrode layer is formed on the MIMCAP diode stack.

Different sequences of layer deposition for the MIMCAP diode can be used. For example, a barrier height modification layer can be deposited, followed by a low leakage dielectric layer, followed by a high leakage dielectric layer. Alternatively, a high leakage dielectric layer can be deposited before a low leakage dielectric layer. Or leakage dielectric layers can be deposited before a barrier height modification layer.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method to form a device, the method comprising
forming a first layer,
wherein the first layer is operable as an electrode;
forming a second layer disposed above the first layer,
wherein the second layer comprises $HfO_x$;
forming a third layer disposed above the first layer,
wherein the third layer comprises doped $HfO_x$,
wherein the second layer has a different band gap than the third layer;
forming a fourth layer disposed above the first layer,
wherein the fourth layer comprises $HfO_x$,
wherein a leakage current of the fourth layer is higher than a leakage current of the third layer; and
forming a fifth layer disposed above the first layer,
wherein the fifth layer is operable as an electrode;
wherein the second layer, the third layer, and the fourth layer are operable to have a higher current flow when biased in a first polarity and a lower current flow when biased in a second polarity;
wherein the second polarity is opposite of the first polarity.

2. The method of claim 1, wherein the third layer is disposed between the second layer the fourth layer, and wherein the second layer, the third layer, and the fourth layers are disposed between the first and fifth layer.

3. The method of claim 1, wherein the fourth layer is disposed between the second layer the third layer, and wherein the second layer, the third layer, and the fourth layers are disposed between the first and fifth layer.

4. The method of claim 1, wherein the second layer is disposed between the third layer the fourth layer, and wherein the second layer, the third layer, and the fourth layers are disposed between the first and fifth layer.

5. The method as in claim 1, further comprising performing a treatment after forming the second layer, the third layer, the fourth layer, or the fifth layer.

6. The method as in claim 5, wherein the treatment comprises a rapid thermal oxidation process.

7. The method as in claim 5, wherein the treatment comprises a plasma annealing process in an oxygen ambient.

8. The method of claim 1, wherein the first layer or the fifth layer comprises at least one of TiN, Ti, Al, $MoO_2$, W, poly-Si, TiSiN, TaSiN, Pr, Ta, or Ni.

9. The method of claim 1, wherein the second layer is operable as a barrier height modification layer.

10. The method of claim 1, wherein the second layer has a thickness of between 1 nanometer and 3 nanometers.

11. The method of claim 1, wherein the third layer has a thickness of between 3 nanometers and 10 nanometers.

12. The method of claim 1, wherein the fourth layer has a thickness of between 3 nanometers and 10 nanometers.

13. The method of claim 1, wherein the first layer comprises a polysilicon.

14. The method of claim 1, further comprising, prior to forming the third layer, in-situ treating the second layer using a rapid thermal oxidation in oxygen ambient.

15. The method of claim 1, further comprising, prior to forming the fourth layer, in-situ treating the third layer using a rapid thermal oxidation in oxygen ambient.

16. The method of claim 1, wherein the third layer is formed using atomic layer deposition by supplying ozone and one of tetrakis (ethylmethylamino) zirconium (TEMAZ), Tris (dimethylamino)cyclopentadienyl Zirconium (ZyALD), tetrakis (ethylmethylamino) hafnium (TEMAHf), or tetrakis (dimethylamido) hafnium (TDMAHf) into a deposition chamber.

17. The method of claim 16, wherein the third layer is formed at a temperature of 250° C. and 300° C.

\* \* \* \* \*